(12) United States Patent
Lee et al.

(10) Patent No.: US 9,524,825 B2
(45) Date of Patent: Dec. 20, 2016

(54) MULTILAYER CERAMIC CAPACITOR AND BOARD FOR MOUNTING THEREOF

(71) Applicant: SAMSUNG ELECTRO-MECHANICS CO., LTD., Suwon-Si, Gyeonggi-Do (KR)

(72) Inventors: Kyo Kwang Lee, Suwon-Si (KR); Jin Kim, Suwon-Si (KR); Young Ghyu Ahn, Suwon-Si (KR); Byoung Hwa Lee, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/518,835

(22) Filed: Oct. 20, 2014

(65) Prior Publication Data
US 2015/0114702 A1    Apr. 30, 2015

(30) Foreign Application Priority Data

Oct. 31, 2013 (KR) .................. 10-2013-0131110
Jul. 7, 2014 (KR) .................. 10-2014-0084594

(51) Int. Cl.
*H01G 4/30*    (2006.01)
*H01G 4/005*   (2006.01)
(Continued)

(52) U.S. Cl.
CPC .............. *H01G 2/065* (2013.01); *H01G 4/012* (2013.01); *H01G 4/30* (2013.01); *H05K 3/3436* (2013.01); *H05K 2201/10015* (2013.01)

(58) Field of Classification Search
CPC ........ H01G 4/30; H01G 4/232; H01G 4/1227; H01G 4/008; H01G 2/065
(Continued)

(56) References Cited

U.S. PATENT DOCUMENTS

| 4,590,437 A | 5/1986 | Butler et al. |
| 8,797,709 B2 | 8/2014 | Chung et al. |

(Continued)

FOREIGN PATENT DOCUMENTS

| JP | 60-048230 U | 4/1985 |
| JP | 2002-203736 A | 7/2002 |

(Continued)

OTHER PUBLICATIONS

Japanese Office Action issued in Japanese Application No. 2014-203082 dated Dec. 8, 2015, with English Translation.
(Continued)

*Primary Examiner* — Eric Thomas
*Assistant Examiner* — Arun Ramaswamy
(74) *Attorney, Agent, or Firm* — McDermott Will & Emery LLP

(57) ABSTRACT

A multilayer ceramic capacitor may include a ceramic body and an active layer. The ceramic body includes three external electrodes disposed on a mounting surface thereof so as to be spaced apart from each other, and first, second, and third lead parts extending from first and second internal electrodes of the ceramic body so as to be exposed to the mounting surface of the ceramic body. One side of at least one of the first, second, and third lead parts connected to the mounting surface of the ceramic body may be at least partially formed as an inclined extension portion that is inclined with respect to an outer periphery of the first or second internal electrode.

27 Claims, 15 Drawing Sheets

(51) Int. Cl.
*H01G 4/06* (2006.01)
*H01G 2/06* (2006.01)
*H01G 4/012* (2006.01)
*H05K 3/34* (2006.01)

(58) Field of Classification Search
USPC .................. 361/301.4, 303, 321.1, 321.2
See application file for complete search history.

(56) References Cited

U.S. PATENT DOCUMENTS

| | | | |
|---|---|---|---|
| 2003/0099083 A1* | 5/2003 | Ohtsuka et al. | 361/303 |
| 2008/0186652 A1 | 8/2008 | Lee et al. | |
| 2011/0096464 A1 | 4/2011 | Togashi et al. | |
| 2013/0050893 A1 | 2/2013 | Kim | |
| 2013/0058006 A1* | 3/2013 | Kim | 361/321.2 |
| 2013/0120899 A1* | 5/2013 | Chung et al. | 361/301.4 |
| 2013/0319741 A1 | 12/2013 | Ahn et al. | |

FOREIGN PATENT DOCUMENTS

| | | |
|---|---|---|
| JP | 2002299152 A | 10/2002 |
| JP | 2004-140183 A | 5/2004 |
| JP | 2004-140211 A | 5/2004 |
| JP | 2009-021512 A | 1/2009 |
| JP | 2011091271 A | 5/2011 |
| JP | 2013-106037 A | 5/2013 |
| JP | 5319007 B1 | 10/2013 |
| KR | 10-0920614 B1 | 10/2009 |
| KR | 2009-0117686 A | 11/2009 |
| KR | 10-2013-0022825 A | 3/2013 |

OTHER PUBLICATIONS

Japanese Office Action issued in Japanese Application No. 2014-203082 dated Aug. 1, 2016, with English Translation.

* cited by examiner

US 9,524,825 B2

MULTILAYER CERAMIC CAPACITOR AND BOARD FOR MOUNTING THEREOF

CROSS-REFERENCE TO RELATED APPLICATIONS

This application claims the benefit of Korean Patent Application No. 10-2013-0131110 filed on Oct. 31, 2013 and Korean Patent Application No. 10-2014-0084594 filed on Jul. 7, 2014, with the Korean Intellectual Property Office, the disclosures of which are incorporated herein by reference.

BACKGROUND

The present disclosure relates to a multilayer ceramic capacitor and a board for mounting the same.

In accordance with the recent trend toward miniaturization and high capacitance of electronic products, the demand for an electronic component has been increased for use in the electronic products having a small size and high capacitance.

In the case of a multilayer ceramic capacitor, when equivalent series inductance (hereinafter, referred to as "ESL") increases, performance of an electronic product may be deteriorated. In addition, as the applied electronic component has been miniaturized and had high capacitance, an influence of an increase in ESL of the multilayer ceramic capacitor on deterioration of performance of the electronic product relatively increased.

Particularly, in accordance with high performance of an integrated circuit (IC), use of a decoupling capacitor increases. Therefore, a demand has been increased for a multilayer ceramic capacitor (MLCC) having a 3-terminal vertical multilayer structure, so-called, "low inductance chip capacitor (LICC)" capable of decreasing inductance of the capacitor by decreasing a distance between external terminals to decrease a current flow path.

SUMMARY

Some embodiments in the present disclosure may provide a multilayer ceramic capacitor capable of significantly improving a low ESL property in a 3-terminal vertical multilayer capacitor, and a board for mounting thereof.

According to some embodiments in the present disclosure, a multilayer ceramic capacitor includes three external electrodes disposed on a mounting surface of a ceramic body. The three external electrodes are spaced apart from each other, and first, second, and third lead parts extend from first and second internal electrodes of the ceramic body to be exposed to the mounting surface of the ceramic body. At least one side of at least one of the first, second, and third lead parts may be at least partially formed as an inclined extension portion that is inclined with respect to an outer periphery of the first or second internal electrode.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
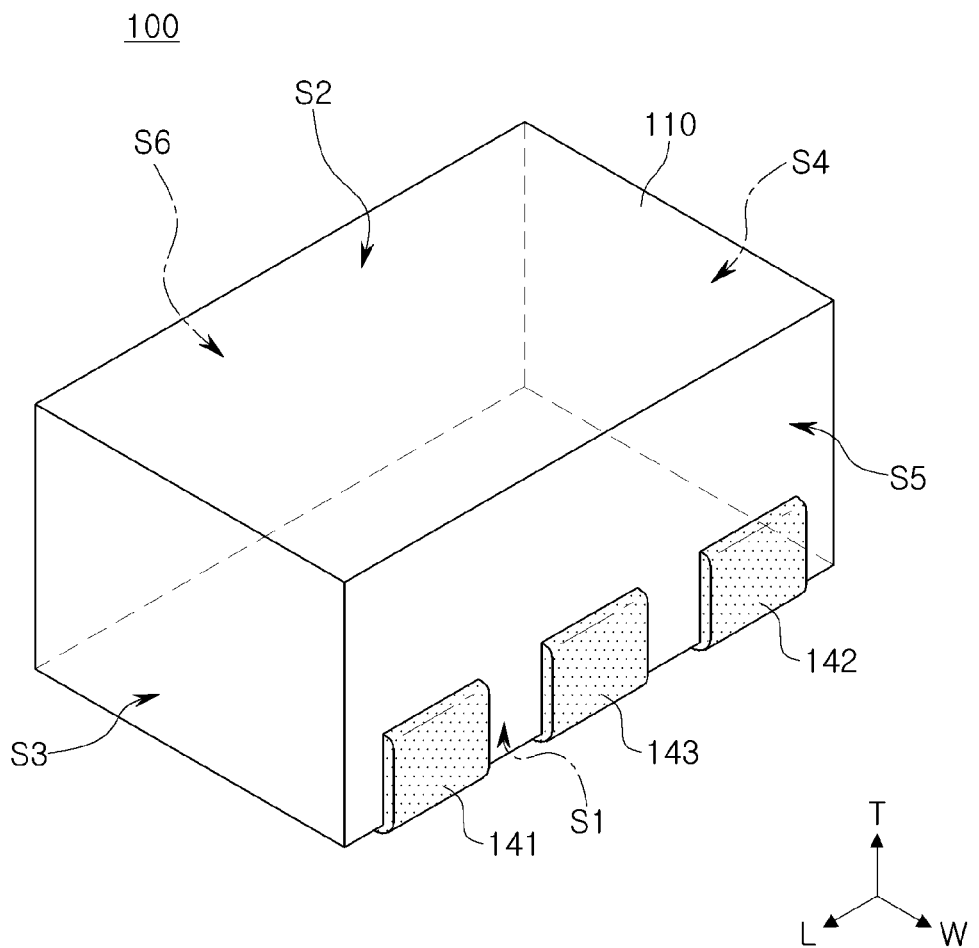
FIG. 1 is a perspective view schematically illustrating a multilayer ceramic capacitor according to an embodiment in the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Directions of a hexahedron will be defined to clearly describe exemplary embodiments of the present disclosure. L, W, and T shown in the accompanying drawings refer to a length direction, a width direction, and a thickness direction, respectively. Here, the width direction may be the same as a stacking direction in which dielectric layers are stacked.

Multilayer Ceramic Capacitor

Figure 2:
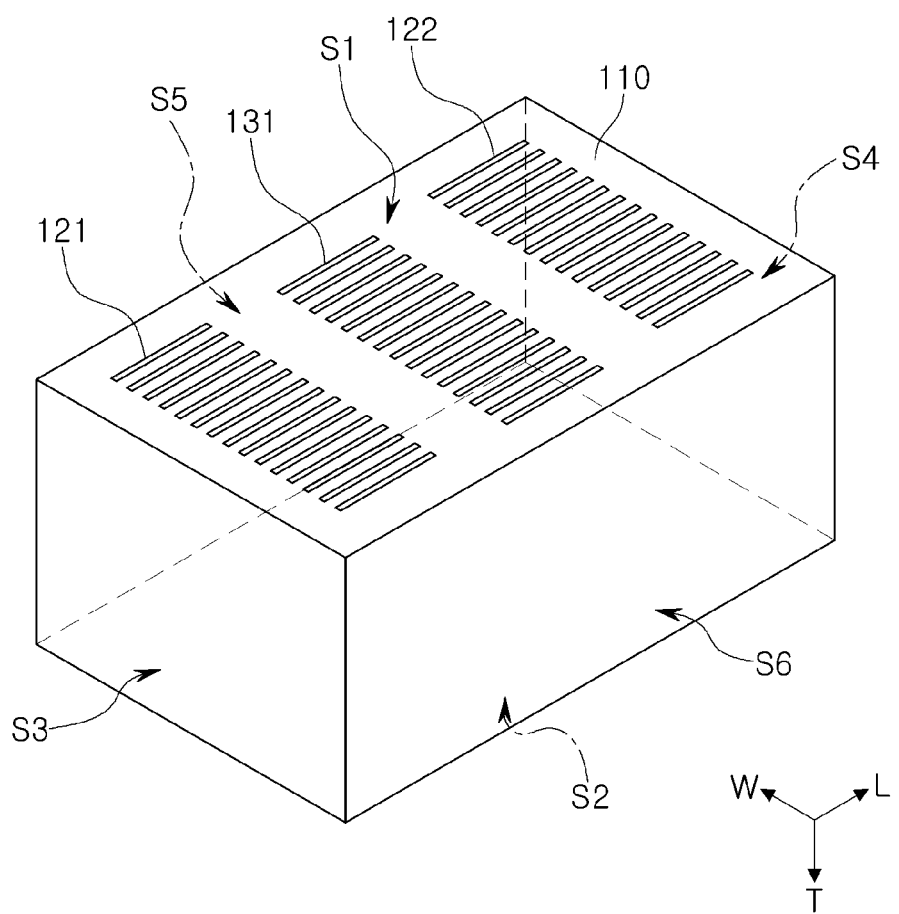
FIG. 2 is a perspective view illustrating a ceramic body of the multilayer ceramic capacitor of FIG. 1 that is overturned.
Figure 3:
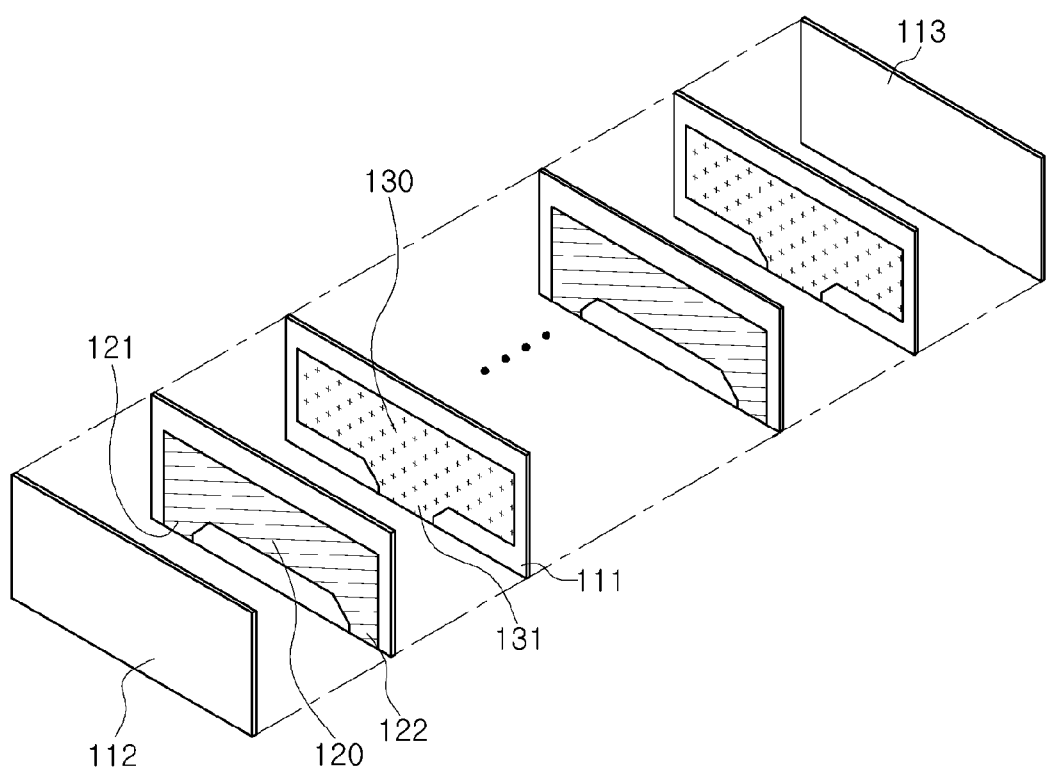
FIG. 3 is an exploded perspective view of the multilayer ceramic capacitor of FIG. 1 from which external electrodes are omitted.
Figure 4:
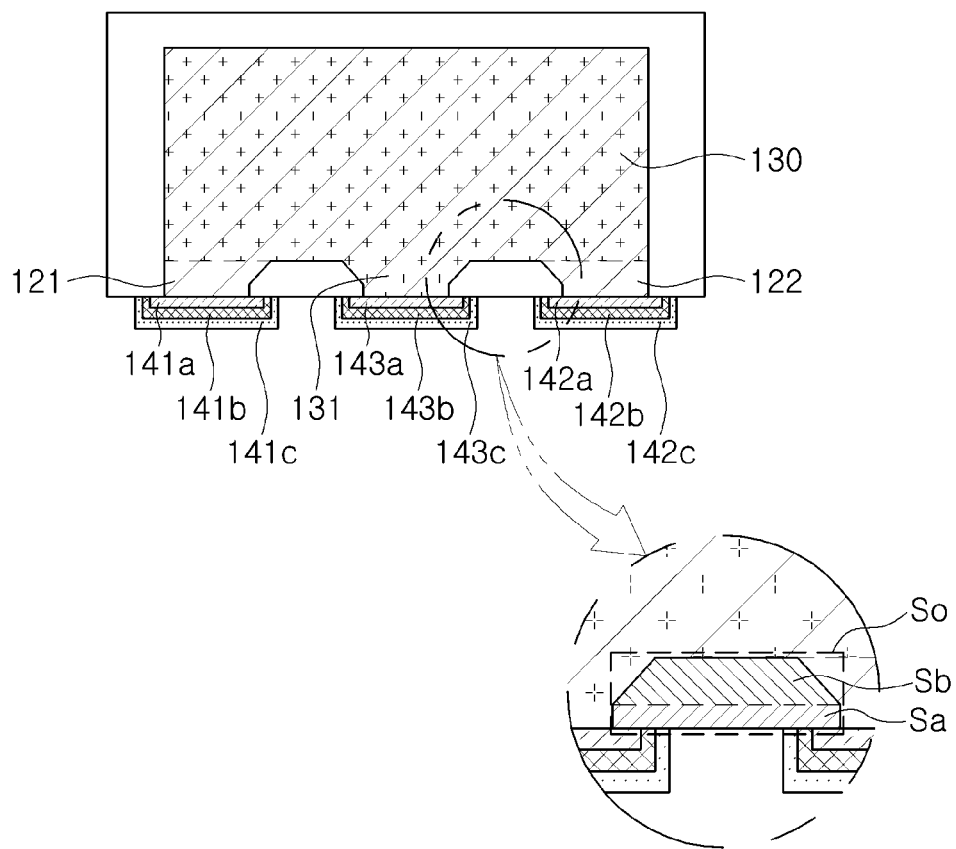
FIG. 4 is a cross-sectional view illustrating the multilayer ceramic capacitor of FIG. 1.

FIG. 1 is a perspective view schematically illustrating a state in which a multilayer ceramic capacitor according to an embodiment in the present disclosure; FIG. 2 is a perspective view illustrating a state in which a ceramic body of the multilayer ceramic capacitor of FIG. 1 that is overturned; FIG. 3 is an exploded perspective view of the multilayer ceramic capacitor of FIG. 1 from which external electrodes are omitted; and FIG. 4 is a cross-sectional view illustrating the multilayer ceramic capacitor of FIG. 1.

Referring to FIGS. 1 through 4, the multilayer ceramic capacitor 100 according to the present exemplary embodiment may include a ceramic body 110 in which a plurality of dielectric layers 111 are stacked in the width direction, an active layer including the first and second internal electrodes 120 and 130, and first to third external electrodes 141, 142, and 143.

The multilayer ceramic capacitor 100 according to the present exemplary embodiment may be considered as a so-called 3-terminal capacitor having a total of 3 external terminals.

The ceramic body 110 may have first and second main surfaces S1 and S2 opposing each other in the thickness direction, fifth and sixth surfaces S5 and S6 connecting the first and second main surfaces S1 and S2 to each other and opposing each other in the width direction, and first and second end surfaces S3 and S4 opposing each other in the length direction.

Hereinafter, in the present exemplary embodiment, a mounting surface of the multilayer ceramic capacitor 100 may be the first surface S1 of the ceramic body 110.

The ceramic body 110 as described above may be formed by stacking the plurality of dielectric layers 111 in the width direction and then sintering the stacked dielectric layers 111, and a shape thereof is not particularly limited, but may be a hexahedral shape as shown in the accompanying drawings.

However, a shape and a dimension of the ceramic body 110 and the number of stacked dielectric layers 111 are not limited to those of the present exemplary embodiment shown in the accompanying drawings, and various shapes, dimensions, and numbers of stacked dielectric layers can be used.

In addition, the plurality of dielectric layers 111 configuring the ceramic body 110 may be in a sintered state. Dielectric layers 111 adjacent to one another may be integrated such that is may be difficult to discern a boundary therebetween without using a scanning electron microscope (SEM).

This ceramic body 110 may include the active layer including the plurality of internal electrodes as a part contributing to forming capacitance of the capacitor and cover layers 112 and 113 formed on both side surfaces of the active layer in the width direction as margin parts.

The active layer may be formed by alternately stacking the first and second internal electrodes 120 and 130 in the width direction, having the dielectric layer 111 therebetween.

In this case, a thickness of the dielectric layer 111 may be optionally changed according to the capacitance design of the multilayer ceramic capacitor 100. For example, a thickness of a single dielectric layer may be preferably 0.01 to 1.00 um after sintering. However, the present disclosure is not limited thereto.

Further, the dielectric layer 111 may contain ceramic powder having high permittivity, for example, barium titanate ($BaTiO_3$)-based powder or strontium titanate ($SrTiO_3$)-based powder, or the like, but the present disclosure is not limited thereto as long as sufficient capacitance may be obtained therefrom.

In addition, if necessary, a ceramic additive, an organic solvent, a plasticizer, a binder, a dispersant, and the like, may be further added to the dielectric layer 111 together with the ceramic powder.

In this case, an average particle size of ceramic powder particles used to form the dielectric layer 111 is not particularly limited and may be controlled according to an embodiment in the present disclosure. For example, the average particle size may be controlled to be 400 nm or less, but the present disclosure is not limited thereto.

The cover layers 112 and 113 may have the same material and configuration as those of the dielectric layer 111 except that internal electrodes are not included therein.

In addition, the cover layers 112 and 113 may be formed by stacking a single dielectric layer or two or more dielectric layers on both side surfaces of the active layer in the width direction, respectively, and may generally serve to prevent the first and second internal electrodes 120 and 130 from being damaged by physical or chemical stress.

The first and second internal electrodes 120 and 130, electrodes having different polarities, may be formed in the ceramic body 110 and disposed to face each other, having a dielectric layer therebetween.

In this case, the first and second internal electrodes 120 and 130 may be electrically insulated from each other by the dielectric layer 111 interposed therebetween.

The first and second internal electrodes 120 and 130 as described above may include a capacitance part formed by overlapping internal electrodes adjacent to each other to contribute to forming capacitance and a lead part formed by partially extending the capacitance part to be exposed outwardly of the ceramic body 110.

The lead part is not particularly limited, but for example, may have a length shorter than a length of the internal electrode configuring the capacitance part.

Further, a thickness of the first and second internal electrodes 120 and 130 may be determined according to the use thereof. For example, the thickness of the first and second internal electrodes may be determined to be in a range of 0.2 to 1.0 um in consideration of a size of the ceramic body 110, but the present disclosure is not limited thereto.

In addition, a material forming the first and second internal electrodes 120 and 130 is not particularly limited. For example, the first and second internal electrodes 120 and 130 may be formed using a conductive paste made of one or more of a noble metal material such as palladium (Pd), a palladium-silver (Pd—Ag) alloy, or the like, nickel (Ni), or copper (Cu).

Further, as a printing method of the conductive paste, a screen printing method, a gravure printing method, or the like, may be used, but the present disclosure is not limited thereto.

In the present exemplary embodiment of the present disclosure, the first internal electrode 120 may have first and second lead parts 121 and 122 spaced apart from each other in the length direction and exposed to the first surface S1 of the ceramic body 110 and may be spaced apart from the third and fourth surfaces S3 and S4 by a predetermined distance.

In addition, the second internal electrode 130 may have a third lead part 131 exposed to the first surface S1 of the ceramic body 110 and spaced part from each of the first and second lead parts 121 and 122 in the length direction by a predetermined distance. Further, the second internal electrode 130 may be spaced from the third and fourth surfaces S3 and S4 by a predetermined distance.

In this case, at least one side of the first to third lead parts 121, 122, or 131 connected to the first surface S1 of the ceramic body 110 may be at least partially formed as an inclined extension portion. The inclined extension portion may be inclined with respect to an outer periphery of the corresponding internal electrode 120 or 130 at an angle different from 90° or 180°.

In addition, if necessary, the inclined extension portion may be formed of a curved surface instead of a linear shape.

In the present exemplary embodiment, inner sides of the first and second lead parts 121 and 122 connecting the capacitance part of the first internal electrode 120 to the first surface S1 of the ceramic body 110 may include an inclined extension portion extended so as to be inclined with respect to the first internal electrode 120 and a vertical extension portion extended from the inclined extension portion perpendicularly to the outer periphery of the first internal electrode 120 toward the first surface S1 of the ceramic body 110. In some embodiments, the vertical extension portion extends vertically from the inclined extension portion in the thickness direction.

In this case, as necessary, the first and second lead parts 121 and 122 may be configured so that outer sides thereof connecting the capacitance part of the first internal electrode 120 to the first surface S1 of the ceramic body 110 may include an inclined extension portion extended so as to be inclined with respect to an outer periphery of the first internal electrode 120 and a vertical extension portion extended perpendicularly to the outer periphery of the internal electrode from the inclined extension portion toward the first main surface S1 of the ceramic body 110, similarly to the inner sides thereof.

Further, one side of the third lead part 131 connecting the capacitance part of the second internal electrode 130 to the first surface S1 of the ceramic body 110 may include an inclined extension portion extended so as to be inclined with respect to an outer periphery of the second internal electrode 130 and a vertical extension portion extended perpendicularly to the outer periphery of the second internal electrode from the inclined extension portion toward the first surface S1 of the ceramic body 110. In some embodiments, the vertical extension portion extends vertically from the inclined extension portion in the thickness direction.

In this case, as necessary, the third lead part 131 may be configured so that both sides of the third lead part 131 connecting the capacitance part of the second internal electrode 130 to the first surface S1 of the ceramic body 110 may include an inclined extension portion extended so as to be inclined with respect to the second internal electrode 130 and a vertical extension portion extended perpendicularly to the second internal electrode from the inclined extension portion toward the first surface S1 of the ceramic body 110, similarly to the one side as described above.

In this case, when an area of a first region between the vertical extension portions of the first or second lead part 121 or 122 and the third lead part 131 is defined as Sa, an area of a second region between the inclined extension portions of the first or second lead part 121 or 122 and the third lead part 131 is defined as Sb, and Sa+Sb is defined as St, Sa/Sb may be in a range of 0.383 to 12 ($0.383 \leq Sa/Sb \leq 12$), and Sa/St may be in a range of 0.277 to 0.923 ($0.277 \leq Sa/St \leq 0.923$).

In a general multilayer ceramic electronic component, an external electrode may be disposed on both end surfaces opposing each other in a length direction of a ceramic body.

However, in this case, at the time of applying an alternative current (AC) voltage to the external electrode, since a current path is long, a current loop may be formed to be larger, and an intensity of induced magnetic field may be increased, such that inductance may be increased.

In order to solve this problem, according to an embodiment in the present disclosure, the first, second, and third external electrodes 141 to 143 may be disposed on the first surface S1 of the ceramic body 110 so as to decrease the current path.

In this case, since an interval between the first and second external electrodes 141 and 142 and the third external electrode 143 is relatively small, the current loop may be decreased, such that inductance may be decreased.

The first and, second external electrodes 141 and 142 may be disposed on the first surface S1 of the ceramic body 110 so as to be spaced apart from each other in the length direction, and connected to the first and second lead parts 121 and 122, respectively. Additionally, the third external electrode 143 may be disposed on the first surface S1 of the ceramic body 110 between the first and second external electrodes 141 and 142 so as to be spaced apart from each of the first and second external electrodes 141 and 142 by a predetermined distance, and connected to the third lead part 131.

In addition, the first, second, and third external electrodes 141 to 143 may be electrically connected to the corresponding lead parts of a respective one of the first and second internal electrodes 120 and 130 in order to form capacitance. Further, if necessary, the first, second, and third external electrodes 141 to 143 may be extended to portions of the fifth and sixth surfaces S5 and S6 of the ceramic body 110 to form bands. In this case, the first, second and third lead part 121, 122 and 131 may be disposed in the inner part of the first, second, third external electrode 141 to 143, respectively. For this, the width of the first, second and third external electrode 141 to 143 may be formed larger than the length of the first, second and third lead part 121, 122 and 131, respectively. According to the above structure, the first surface S1 of the ceramic body 110 may not formed extra insulating layers because the first, second and third lead part 121, 122 and 131 does not been exposed by the first surface S1 of the ceramic body.

Meanwhile, the first, second, and third external electrodes 141 to 143 as described above may have a three layer structure and may include first, second, and third conductive layers 141a to 143a contacting the corresponding lead parts of the internal electrodes, respectively, to thereby be connected thereto; first, second, and third nickel (Ni) plating layers 141b to 143b formed so as to cover the first, second, and third conductive layers 141a to 143a, respectively; and first, second, and third tin (Sn) plating layers 141c to 143c formed so as to cover the first, second, and third nickel plating layers 141b to 143b, respectively.

The first, second, and third conductive layers 141a to 143a may be formed of the same conductive material as that of the first and second internal electrodes 120 and 130, but are not limited thereto. For example, the first, second, and third conductive layers 141a to 143a may be formed of powder of a metal such as copper (Cu), silver (Ag), nickel (Ni), and the like, and formed by applying a conductive paste prepared by adding glass frit to this metal powder and then sintering the applied conductive paste.

Experimental Example

Multilayer ceramic capacitors according to Inventive Examples and Comparative Examples of the present disclosure were manufactured as follows.

Slurry containing powder such as barium titanate ($BaTiO_3$) powder, or the like, was applied and dried onto a carrier film to prepare a plurality of ceramic green sheets having a thickness of 1.8 μm.

Next, a first internal electrode having first and second lead parts exposed to a first surfaces of the ceramic green sheet and a second internal electrode having a third lead part spaced apart from the first and second lead parts and exposed to the first surfaces of the ceramic green sheet may be formed by applying a conductive paste for a nickel internal electrode onto the ceramic green sheet using a screen.

In this case, the first and second internal electrodes may be formed so that the first, second, and third lead parts include an inclined extension portion inclined with respect to an outer periphery of the first and second internal electrodes and a vertical extension portion extended perpendicularly to the outer periphery of the internal electrode from the inclined extension portion toward a mounting surface of a ceramic body.

Then, about 200 ceramic green sheets were stacked, but ceramic green sheets on which the first and second internal electrodes were not formed were further stacked on both side surfaces in a width direction, thereby manufacturing a multilayer body. Thereafter, the isostatic pressing was performed on this multilayer body at 85° C. and a pressure of 1000 kgf/cm$^2$.

Next, the ceramic multilayer body subjected to the isostatic pressing was cut in the form of an individual chip, and the cut chip was subjected to a debinding process by being maintained at 230° C. for 60 hours under air atmosphere.

Then, the ceramic multilayer body was prepared by sintering the chip at about 1,200° C. under reduction atmosphere having oxygen partial pressure of $10^{-11}$ atm to $10^{-10}$ atm lower than Ni—NiO equilibrium oxygen partial pressure so that the internal electrode was not oxidized.

A chip size of the multilayer chip capacitor after sintering was about 1.0 mm×0.5 mm (Length×Width (L×W), 1005 size). Here, a manufacturing tolerance was determined in a range of ±0.1 mm (length×width (L×W)).

Thereafter, the multilayer ceramic capacitor was completed by performing a process of forming first, second, and third external electrodes on a first surface of the ceramic body so as to correspond to the lead parts of the first and second internal electrodes, respectively, and a test for measuring whether or not a delamination defect occurs and a test for measuring equivalent serial inductance (ESL) were performed. The results are illustrated in Table 1. Each of the tests was performed on 200 test samples.

Here, an area of a first region between the vertical extension portions of the first or second lead part and the third lead part is defined as Sa, an area of a second region between the inclined extension portions of the first or second lead part and the third lead part is defined as Sb, and the sum Sa+Sb is defined as St.

Referring to Table 1, it may be confirmed that in samples 1 to 17 in which a ratio (Sa/St) of the area Sa of the first region between the vertical extension portions of the lead parts to the area St of the entire region was 0.923 or less, ESL was low (45 pH or less) and in samples 18 and 19 in which Sa/St was more than 0.923, ESL was more than 45 pH.

Therefore, Sa/St may be, for example, 0.923 or less.

Further, in samples 1 to 3 in which a ratio (Sa/Sb) of the area Sa of the region between the vertical extension portions of the lead parts to the area Sb of the second region between the inclined extension portions of the lead parts was less than 0.383, a delamination defect occurred.

Therefore, Sa/Sb may be 0.383 or more.

Modified Example

Figure 5:
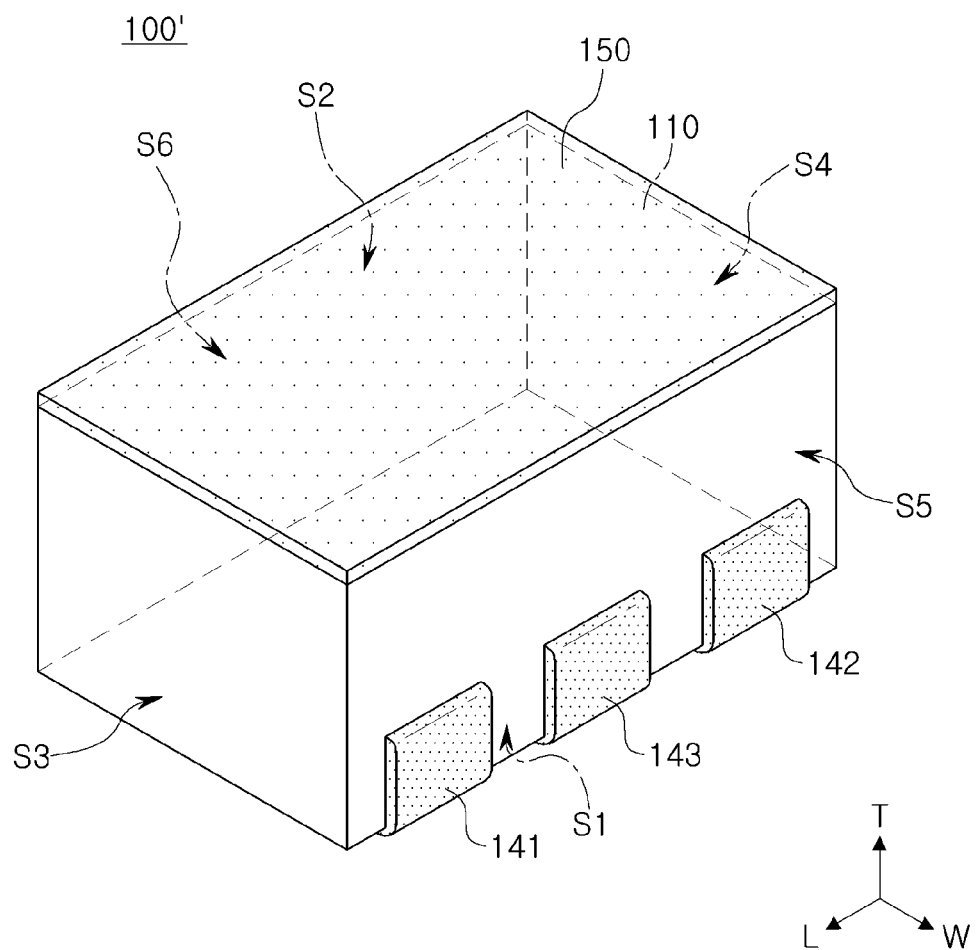
FIG. 5 is a perspective view schematically illustrating a multilayer ceramic capacitor according to another embodiment in the present disclosure.
Figure 6:
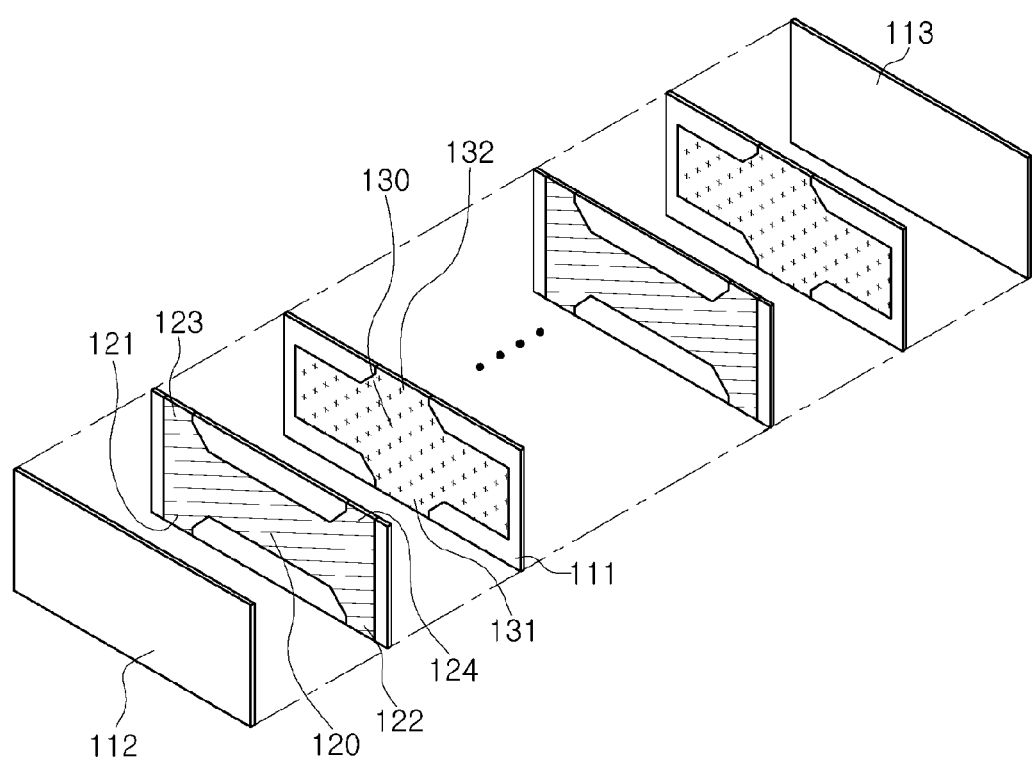
FIG. 6 is an exploded perspective view of the multilayer ceramic capacitor of FIG. 5 from which external electrodes are omitted.
Figure 7:
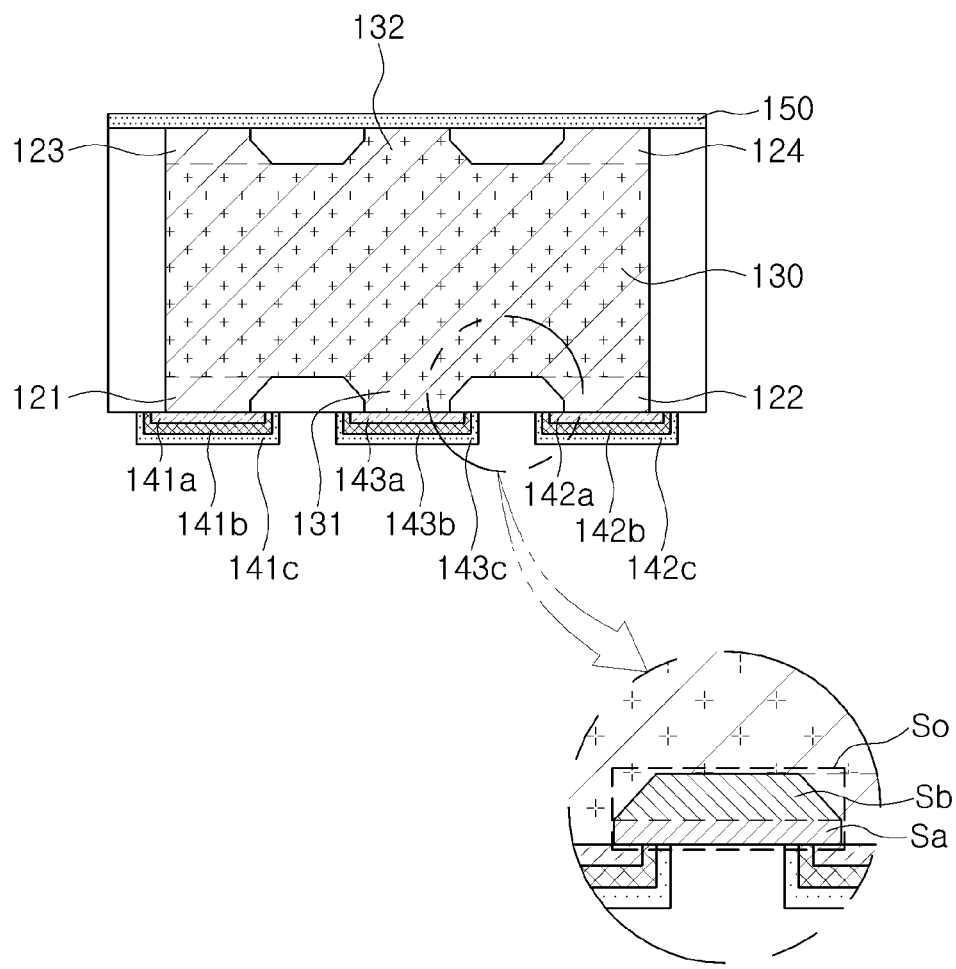
FIG. 7 is a cross-sectional view illustrating the multilayer ceramic capacitor of FIG. 5.

FIG. 5 is a perspective view schematically illustrating a multilayer ceramic capacitor according to another embodiment in the present disclosure; FIG. 6 is an exploded perspective view of the multilayer ceramic capacitor of FIG. 5 from which external electrodes are omitted; FIG. 7 is a cross-sectional view illustrating the multilayer ceramic capacitor of FIG. 5.

Here, since a structure of the ceramic body 110 is the same as that in the foregoing exemplary embodiment, a detailed description thereof will be omitted in order to avoid an overlapping description, and first and second internal electrodes 120 and 130 having different structures from those in the foregoing exemplary embodiment of the present disclosure and an insulation layer 150 will be described in detail.

Referring to FIGS. 5 through 7, in the multilayer ceramic capacitor 100' according to the present exemplary embodiment, the insulation layer 150 may be disposed on a second surface S2 opposing a mounting surface of the ceramic body 110.

The first internal electrode 120 may have fourth and fifth lead parts 123 and 124 exposed to the second main surface

TABLE 1

| No | So | Sa | Sb | St | Sa/St | St/So | Sa/Sb ratio | Delamination | ESL [pH] |
|----|-------|-------|-------|-------|-------|-------|-------|--------|------|
| 1  | 15120 | 0     | 7560  | 7560  | 0     | 0.5   | 0     | 50/200 | 37.8 |
| 2  | 15120 | 810   | 7155  | 7965  | 0.102 | 0.527 | 0.113 | 12/200 | 38.2 |
| 3  | 15120 | 1620  | 6750  | 8370  | 0.194 | 0.554 | 0.240 | 5/200  | 38.7 |
| 4  | 15120 | 2430  | 6345  | 8775  | 0.277 | 0.580 | 0.383 | 0/200  | 39.2 |
| 5  | 15120 | 3240  | 5940  | 9180  | 0.353 | 0.607 | 0.545 | 0/200  | 39.9 |
| 6  | 15120 | 4050  | 5535  | 9585  | 0.423 | 0.634 | 0.732 | 0/200  | 40.2 |
| 7  | 15120 | 4860  | 5130  | 9990  | 0.486 | 0.661 | 0.947 | 0/200  | 40.6 |
| 8  | 15120 | 5670  | 4725  | 10395 | 0.545 | 0.688 | 1.200 | 0/200  | 41.3 |
| 9  | 15120 | 6480  | 4320  | 10800 | 0.600 | 0.714 | 1.500 | 0/200  | 41.9 |
| 10 | 15120 | 7290  | 3915  | 11205 | 0.651 | 0.741 | 1.862 | 0/200  | 42.2 |
| 11 | 15120 | 8100  | 3510  | 11610 | 0.698 | 0.768 | 2.308 | 0/200  | 42.5 |
| 12 | 15120 | 8910  | 3105  | 12015 | 0.742 | 0.795 | 2.870 | 0/200  | 42.9 |
| 13 | 15120 | 9720  | 2700  | 12420 | 0.783 | 0.821 | 3.600 | 0/200  | 43.1 |
| 14 | 15120 | 10530 | 2295  | 12825 | 0.821 | 0.848 | 4.588 | 0/200  | 43.5 |
| 15 | 15120 | 11340 | 1890  | 13230 | 0.857 | 0.875 | 6.000 | 0/200  | 44.1 |
| 16 | 15120 | 12150 | 1485  | 13635 | 0.891 | 0.902 | 8.182 | 0/200  | 44.5 |
| 17 | 15120 | 12960 | 1080  | 14040 | 0.923 | 0.929 | 12.000 | 0/200 | 44.9 |
| 18 | 15120 | 13770 | 675   | 14445 | 0.953 | 0.955 | 20.400 | 0/200 | 46   |
| 19 | 15120 | 14580 | 270   | 14850 | 0.982 | 0.982 | 54.000 | 0/200 | 47.5 |

S2 of the ceramic body 110 to contact the insulation layer 150 formed on the second main surface S2 of the ceramic body 110.

The second internal electrode 130 may have a sixth lead part 132 disposed between the fourth and fifth lead parts 123 and 124 and exposed to the second surface S2 of the ceramic body 110 to thereby contact the insulation layer 150.

Figure 8:
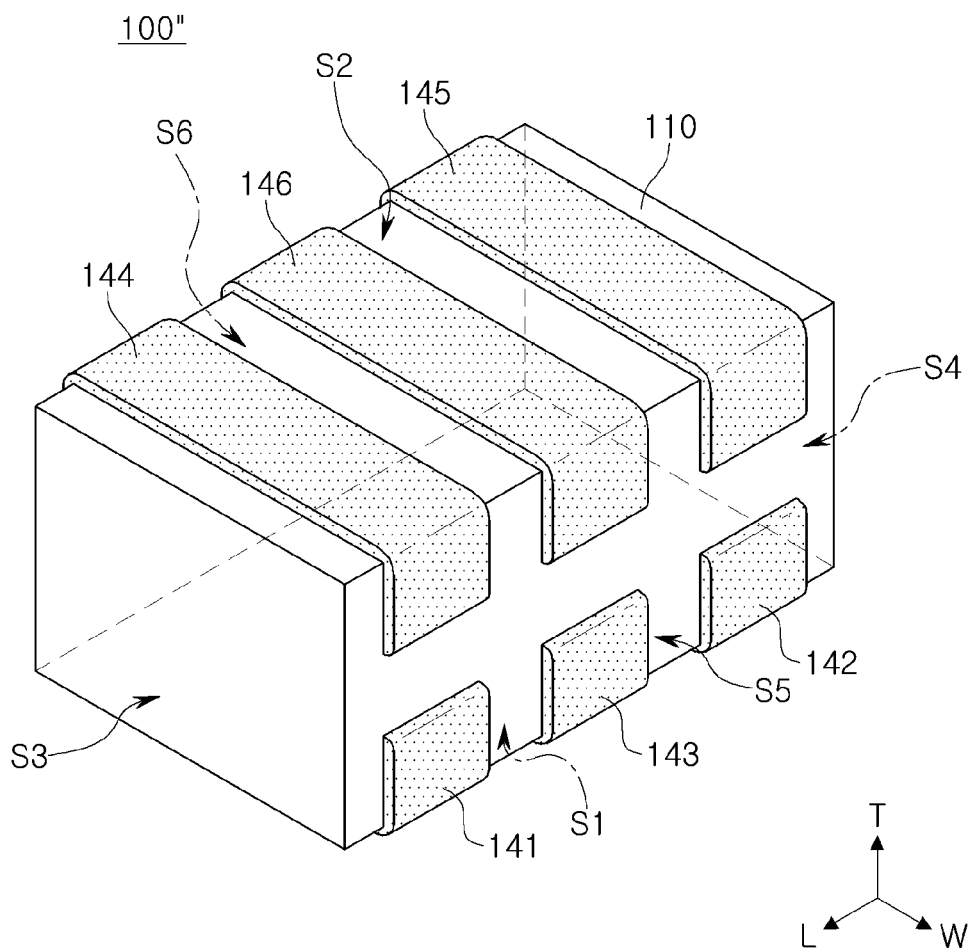
FIG. 8 is a perspective view schematically illustrating a multilayer ceramic capacitor according to another embodiment in the present disclosure.
Figure 9:
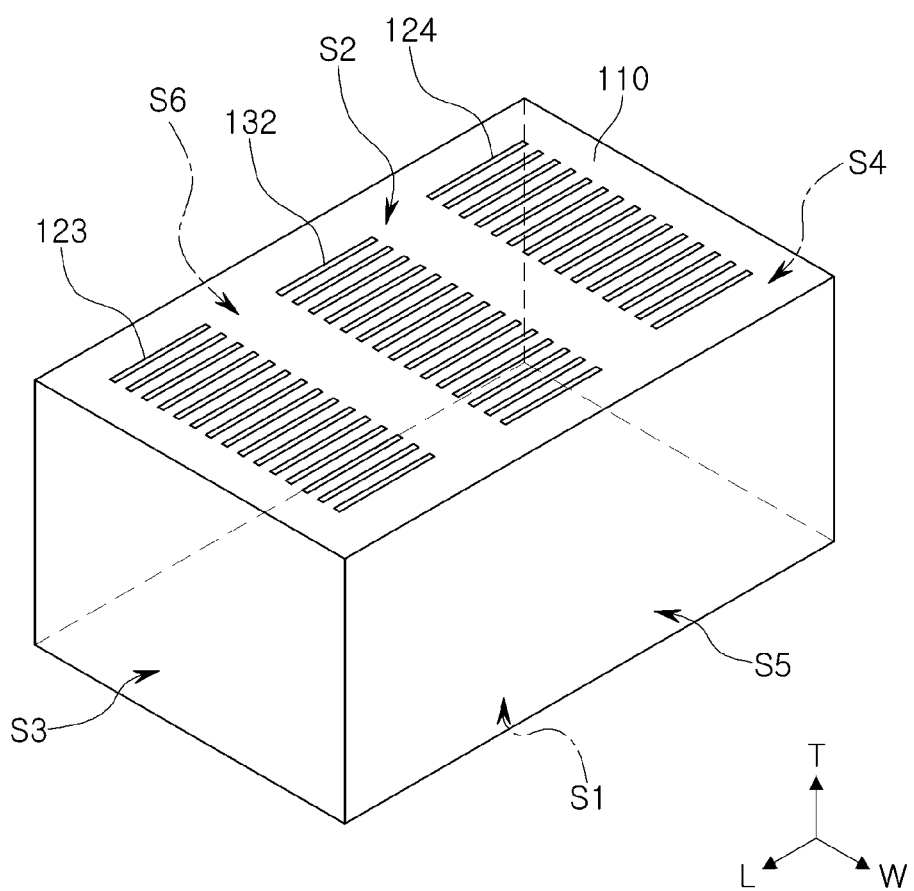
FIG. 9 is a perspective view illustrating a ceramic body of the multilayer ceramic capacitor of FIG. 8.
Figure 10:
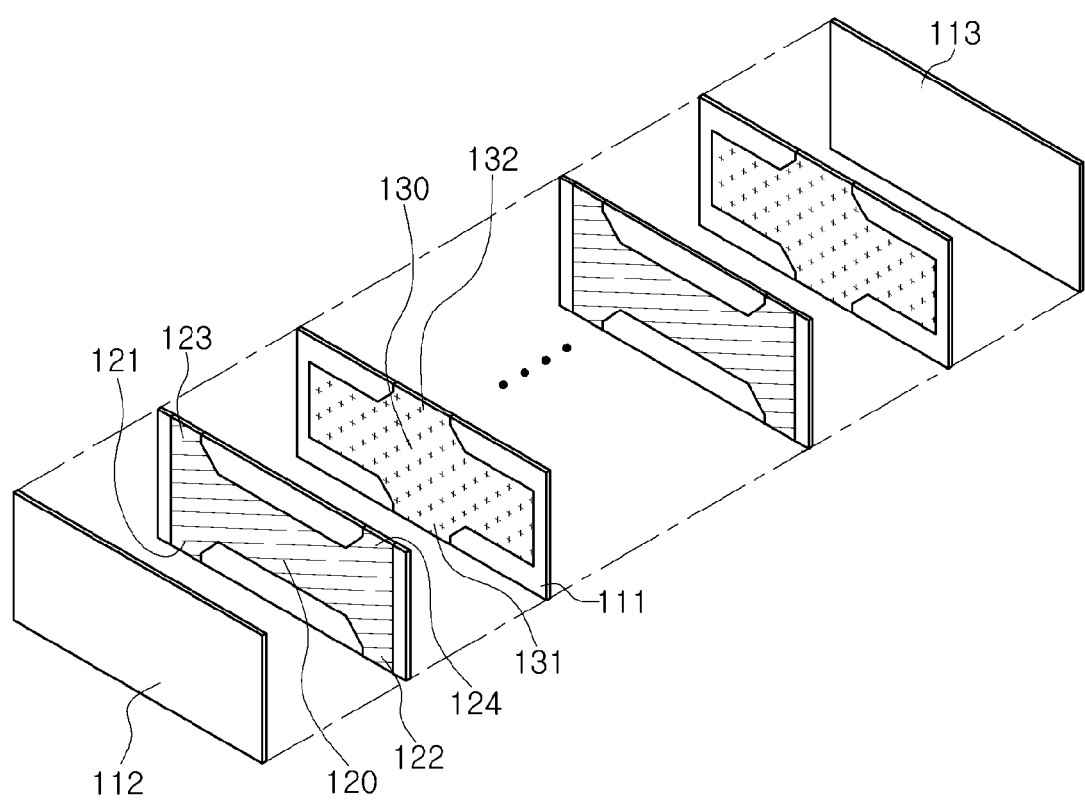
FIG. 10 is an exploded perspective view of the multilayer ceramic capacitor of FIG. 8 from which external electrodes are omitted.
Figure 11:
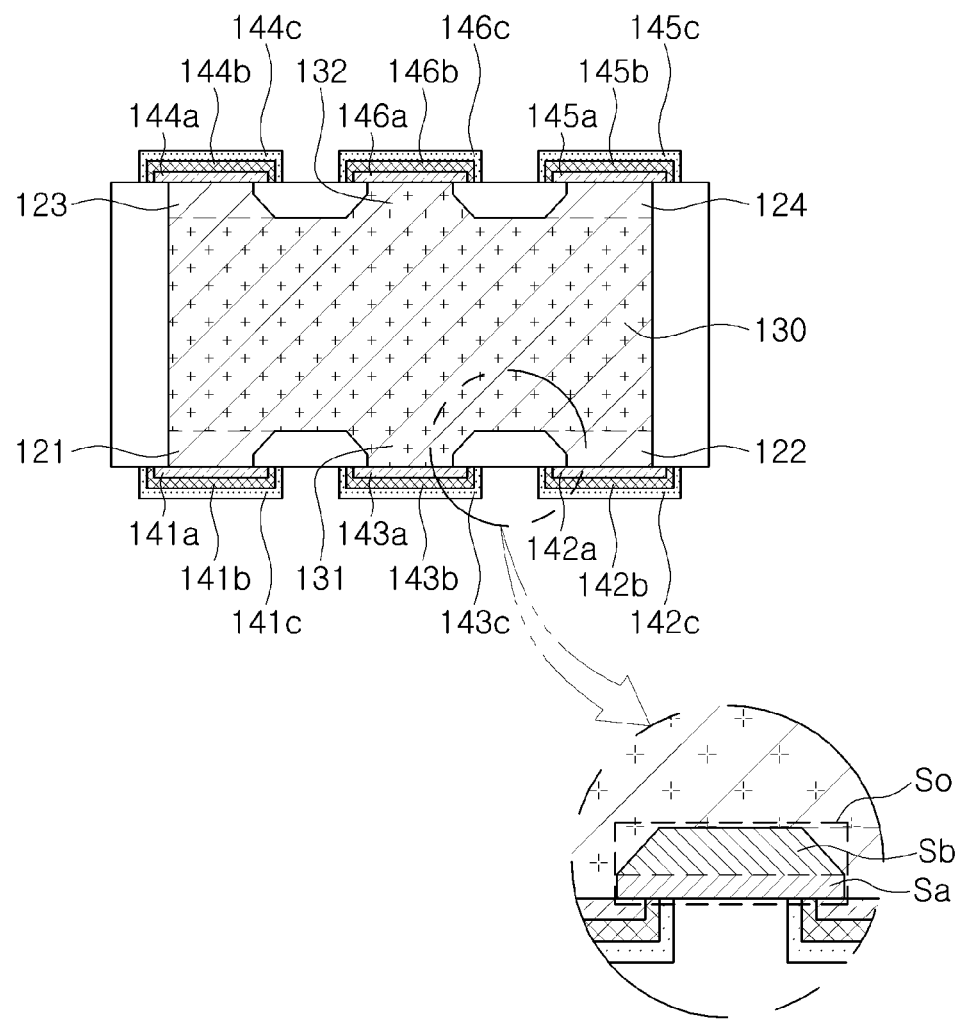
FIG. 11 is a cross-sectional view illustrating the multilayer ceramic capacitor of FIG. 8.

FIG. 8 is a perspective view schematically illustrating a multilayer ceramic capacitor according to another embodiment in the present disclosure; FIG. 9 is a perspective view illustrating a ceramic body of the multilayer ceramic capacitor of FIG. 8; FIG. 10 is an exploded perspective view of the multilayer ceramic capacitor of FIG. 8 from which external electrodes are omitted; and FIG. 11 is a cross-sectional view illustrating the multilayer ceramic capacitor of FIG. 8.

Here, since a structure of the ceramic body 110 is the same as that in the foregoing exemplary embodiment, a detailed description thereof will be omitted in order to avoid an overlapped description, and fourth, fifth, and sixth external electrodes 144 to 146 and first and second internal electrodes 120 and 130 having different structures from those in the foregoing exemplary embodiment will be described in detail.

Referring to FIGS. 8 through 11, in a multilayer ceramic capacitor 100'' according to the present exemplary embodiment, the fourth, fifth, and sixth external electrodes 144 to 146 may be disposed on a second surface S2 of the ceramic body 110 so as to oppose first, second, and third external electrodes 141 to 143, respectively.

In this case, if necessary, the fourth, fifth, and sixth external electrodes 144 to 146 may be extended to portions of fifth and sixth surfaces S5 and S6 of the ceramic body 110.

The fourth, fifth, and sixth external electrodes 144 to 146 as described above may have a three layer structure and include fourth, fifth, and sixth conductive layers 144a to 146a contacting the corresponding lead parts of the internal electrodes, respectively, to thereby be connected thereto; fourth, fifth, and sixth nickel (Ni) plating layers 144b to 146b formed so as to cover the fourth, fifth, and sixth conductive layers 144a to 146a, respectively; and fourth, fifth, and sixth tin (Sn) plating layers 144c to 146c formed so as to cover the fourth, fifth, and sixth nickel plating layers 144b to 146b, respectively.

The first internal electrode 120 may have fourth and fifth lead parts 123 and 124 exposed to the second surface S2 of the ceramic body 110 to thereby be connected to the fourth and fifth external electrodes 144 and 145 formed on the second main surface S2 of the ceramic body 110, respectively.

The second internal electrode 130 may have a sixth lead part 132 disposed between the fourth and fifth lead parts 123 and 124 and exposed to the second surface S2 of the ceramic body 110 to thereby be connected to the sixth external electrode 146.

As described above, in the case in which the multilayer ceramic capacitor 100'' has a vertically symmetric internal and external structure, directionality of the capacitor may be removed.

For example, the multilayer ceramic capacitor 100'' has a vertically symmetric structure, such that a defect in terms of directionality occurring in the case of the related art in which the mounting surface is provided as a single mounting surface at the time of mounting the multilayer ceramic capacitor 100'' on a board may be prevented.

Therefore, since either of the first and second surfaces S1 and S2 of the multilayer ceramic capacitor 100'' may be used as the mounting surface, there is an advantage in that at the time of mounting the multilayer ceramic capacitor 100'' on the board, there is no need to consider directionality of the mounting surface.

In this case, at least one side of at least one of the fourth, fifth, and sixth lead parts 123, 124, and 132 connected to the second surface S2 of the ceramic body 110 may be at least partially formed as an inclined extension portion.

In addition, if necessary, the inclined extension portion may be formed of a curved surface instead of a linear shape.

In the present exemplary embodiment, inner sides of the fourth and fifth lead parts 123 and 124 connecting a capacitance part of the first internal electrode 120 to the second surface S2 of the ceramic body 110 may include an inclined extension portion inclined with respect to an outer periphery of the first internal electrode 120 and a vertical extension portion extended perpendicularly to the outer periphery of the first internal electrode from the inclined extension portion toward the second surface S2 of the ceramic body 110.

In this case, if necessary, the fourth and fifth lead parts 123 and 124 may be configured so that outer sides thereof connecting the capacitance part of the first internal electrode 120 to the second surface S2 of the ceramic body 110 include an inclined extension portion extended so as to be inclined with respect to an outer periphery of the first internal electrode 120 and a vertical extension portion extended perpendicularly to an outer periphery of the first internal electrode from the inclined extension portion toward the second surface S2 of the ceramic body 110, similarly to the inner sides thereof.

Further, one side of the sixth lead part 132 connecting the capacitance part of the second internal electrode 130 to the second surface S2 of the ceramic body 110 may include an inclined extension portion extended so as to be inclined with respect to the second internal electrode 130 and a vertical extension portion extended perpendicularly to the second internal electrode from the inclined extension portion toward the second surface S2 of the ceramic body 110.

In this case, if necessary, the sixth lead part 132 may be configured so that both sides of the sixth lead part 132 connecting the capacitance part of the second internal electrode 130 to the second surface S2 of the ceramic body 110 may include an inclined extension portion extended so as to be inclined with respect to the second internal electrode 130 and a vertical extension portion extended perpendicularly to the second internal electrode from the inclined extension portion toward the second surface S2 of the ceramic body 110, similarly to one side as described above.

In this case, when an area of a first region between the vertical extension portions of the fourth or fifth lead part 123 or 124 and the sixth lead part 132 is defined as Sa, an area of a second region between the inclined extension portions of the fourth or fifth lead part 123 or 124 and the sixth lead part 132 is defined as Sb, and the sum Sa+Sb is defined as St, the ratio Sa/Sb may be in a range of 0.383 to 12 ($0.383 \leq Sa/Sb \leq 12$), and the ratio Sa/St may be in a range of 0.277 to 0.923 ($0.277 \leq Sa/St \leq 0.923$).

Meanwhile, whether or not the delamination defect has occurred and an ESL value depending on the values of first and second space parts prepared between the first, second, and third lead parts illustrated in Table 1 may be equally applied to the values of the space parts prepared between the fourth, fifth, and sixth lead parts.

Figure 12:
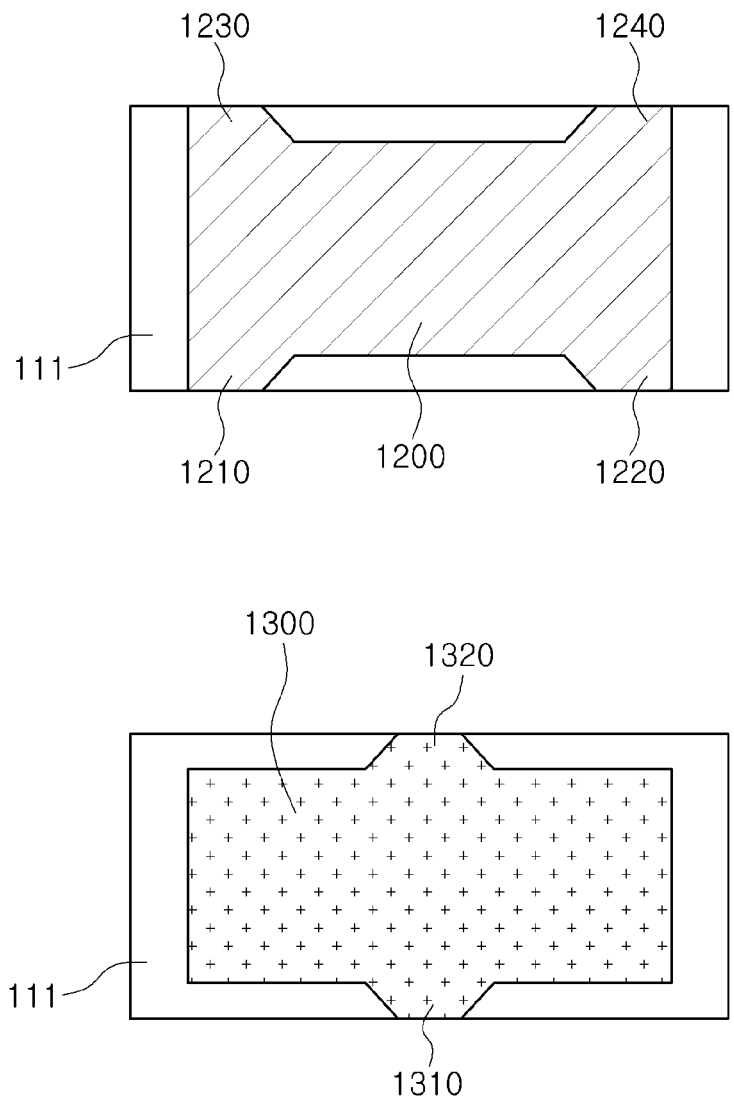
FIG. 12 is a plan view illustrating an example of lead parts in the multilayer ceramic capacitor according to an embodiment in the present disclosure.

FIG. 12 is a plan view illustrating an example of lead parts in the multilayer ceramic capacitor according to an embodiment in the present disclosure.

Referring to FIG. 12, at least one side of portions of first through sixth lead parts 1210, 1220, 1230, 1240, 1310 and 1320 of first and second internal electrodes 1200 and 1300 connected to a ceramic body 110 may only be formed as an inclined extension portion formed of a linear shape.

Here, since other formation structures of the first and second internal electrodes 1200 and 1300 and first through sixth external electrodes 141 to 146 are similar to those in the foregoing exemplary embodiment of the present disclosure, a detailed description thereof will be omitted in order to avoid an overlapped description.

Figure 13:
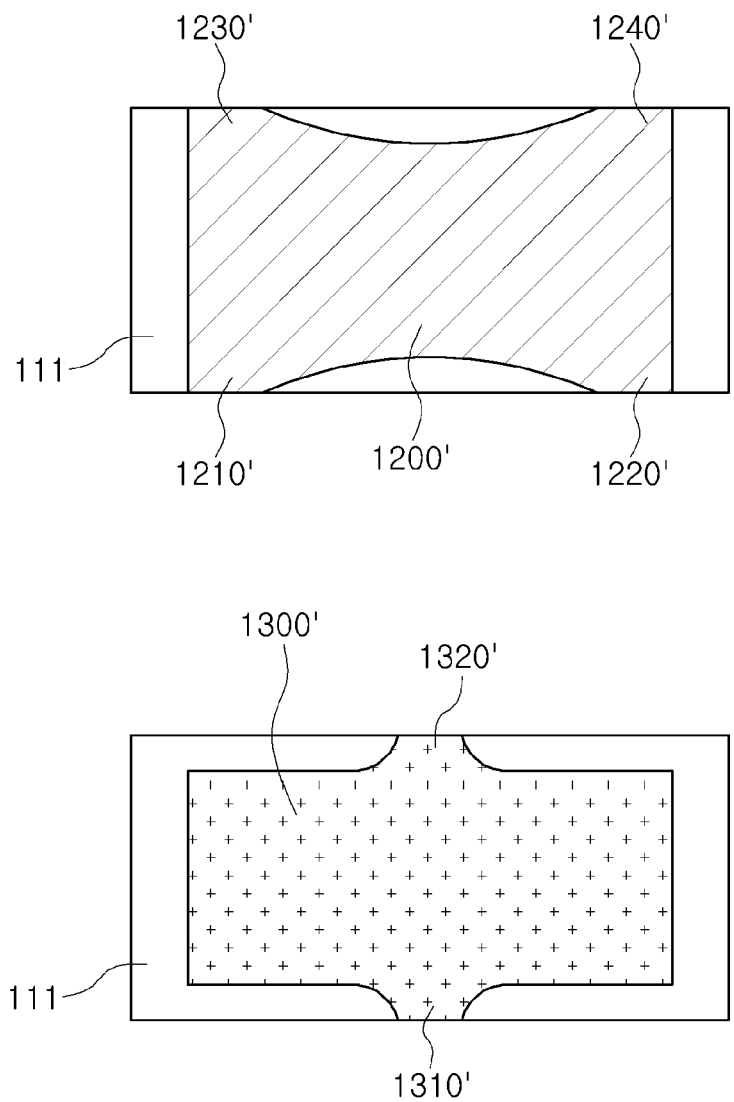
FIG. 13 is a plan view illustrating another example of lead parts in the multilayer ceramic capacitor according to an embodiment in the present disclosure.

FIG. 13 is a plan view illustrating another example of lead parts in the multilayer ceramic capacitor according to an embodiment in the present disclosure.

Referring to FIG. 13, in the case of a first internal electrode 1200', a side connecting first and second lead parts 1210' and 1220' to each other and connected to a first surface S1 of a ceramic body 110 is formed of a single curve, and a side connecting fourth and fifth lead parts 1230' and 1240' to each other and connected to a second surface S2 of the ceramic body 110 is formed of a single curve.

In addition, both sides of third and sixth lead parts 1310' and 1320' of a second internal electrode 1300' connected to a mounting surface of the ceramic body 110 may each be formed of a curve.

Here, since basic structures of the first and second internal electrodes 1200' and 1300' and first through sixth external electrodes 141 to 146 are similar to those in the foregoing exemplary embodiment of the present disclosure, a detailed description thereof will be omitted in order to avoid an overlapped description.

Board for Mounting of Multilayer Ceramic Capacitor

Figure 14:
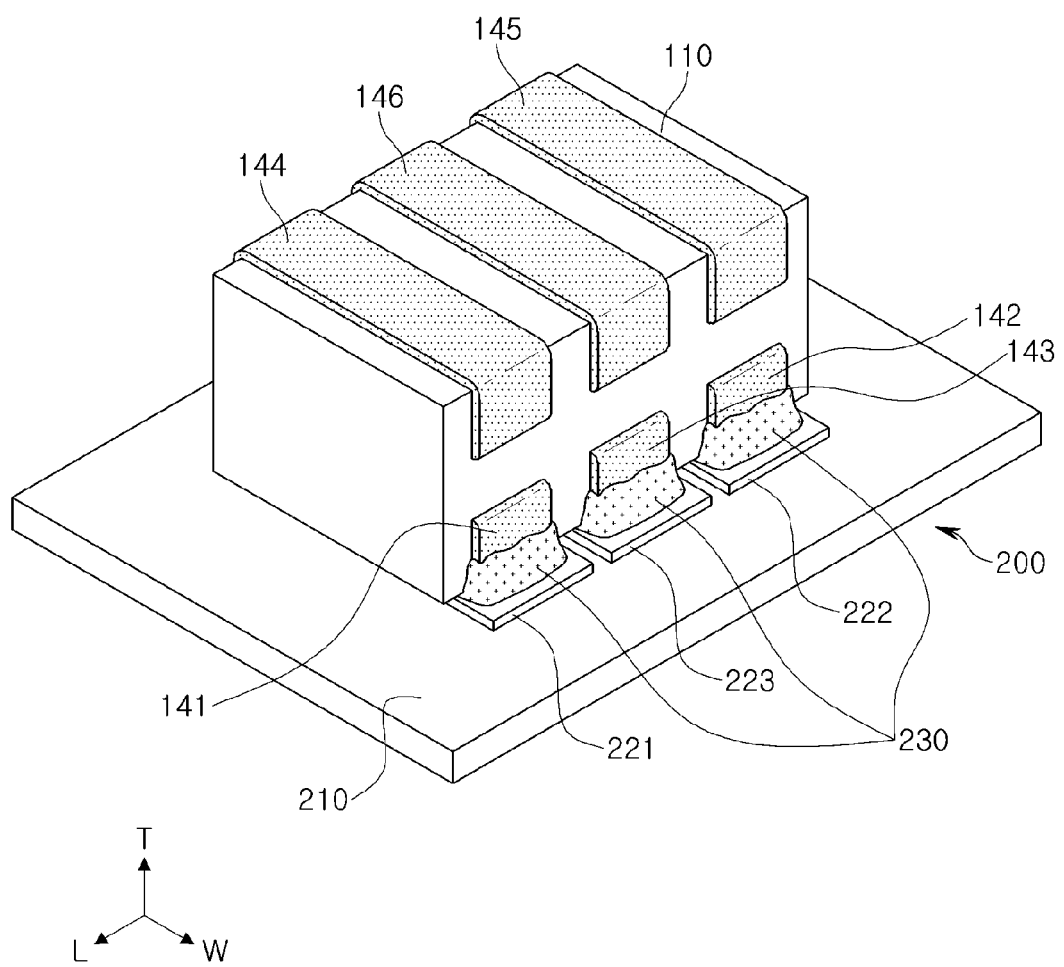
FIG. 14 is a perspective view illustrating a form in which the multilayer ceramic capacitor of FIG. 8 is mounted on a board.
Figure 15:
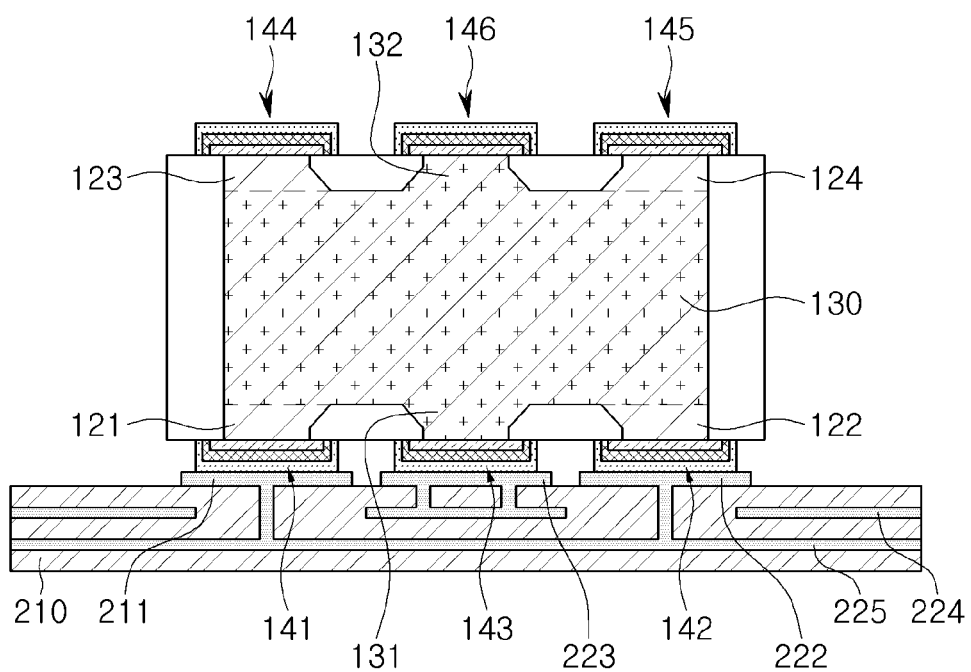
FIG. 15 is a cross-sectional view illustrating the form in which the multilayer ceramic capacitor of FIG. 8 is mounted on the board.

FIG. 14 is a perspective view illustrating a multilayer ceramic capacitor such as that shown in FIG. 8 that is mounted on a board, and FIG. 15 is a cross-sectional view of FIG. 14.

Referring to FIGS. 14 and 15, a board 200 for mounting of a multilayer ceramic capacitor according to the exemplary embodiment of the present disclosure may include a substrate 210 on which the multilayer ceramic capacitor is mounted and first, second, and third electrode pads 221 to 223 formed on the substrate 210 so as to be spaced apart from each other.

In this case, the multilayer ceramic capacitor may be electrically connected to the substrate 210 by solder 230 in a state in which first, second, and third external electrodes 141 to 143 are positioned on the first, second, and third electrode pads 221 to 223, respectively, so as to contact each other.

In FIG. 15, a reference numeral 224 indicates a ground terminal, and a reference numeral 225 indicates a power terminal.

Meanwhile, although the case in which the multilayer ceramic capacitor of FIG. 8 is mounted is described in the exemplary embodiment of the present disclosure, the present disclosure is not limited thereto. For example, the multilayer ceramic capacitors illustrated in FIGS. 1 and 5 may be mounted on the board 200 in a similar manner.

As set forth above, according to embodiments in the present disclosure, ESL may be reduced and an ESL degree of scattering may be improved by at least partially forming one side of the lead part connected to the mounting surface of the ceramic body as an inclined extension portion so as to decrease a length of the current path.

While exemplary embodiments have been shown and described above, it will be apparent to those skilled in the art that modifications and variations could be made without departing from the scope of the present invention as defined by the appended claims.

What is claimed is:

1. A multilayer ceramic capacitor comprising:
a ceramic body including a plurality of dielectric layers stacked in a width direction of the ceramic body;
an active layer including mutually adjacent first and second internal electrodes alternately disposed in the width direction of the ceramic body with a respective dielectric layer interposed therebetween;
first and second lead parts, each extending from a corresponding first internal electrode to be exposed to a mounting surface of the ceramic body in a thickness direction of the ceramic body;
a third lead part extending from a corresponding second internal electrode to be exposed to the mounting surface of the ceramic body, and disposed between the first and second lead parts in a length direction of the ceramic body;
first and second external electrodes disposed on the mounting surface of the ceramic body and respectively connected to the first and second lead parts; and
a third external electrode disposed on the mounting surface of the ceramic body between the first and second external electrodes and connected to the third lead part,
wherein at least one side of one of the first, second, and third lead parts are at least partially formed as an inclined extension portion, and an edge of the first or second lead part, which is the farthest edge thereof from the third lead part, is aligned with an edge of the corresponding first internal electrode in the thickness direction of the ceramic body,
the first, second, and third lead parts each comprise inclined extension portions that extend so as to be inclined with respect to an outer periphery of the first and second internal electrodes and vertical extension portions that extend perpendicularly to the outer periphery of the first and second electrodes from the inclined extension portions toward the mounting surface of the ceramic body, and
a ratio Sa/Sb of a maximum area Sa, projected on a length-thickness plane, of a first region between the vertical extension portions of the first or second lead part and the third lead part, to a maximum area Sb, projected on the length-thickness plane, of a second region between the inclined extension portions of the first or second lead part and the third lead part, is in a range of 0.383 to 12 ($0.383 \leq Sa/Sb \leq 12$).

2. The multilayer ceramic capacitor of claim 1, wherein the first and second internal electrodes are disposed to be spaced apart from both end surfaces of the ceramic body in the length direction.

3. A multilayer ceramic capacitor comprising:
a ceramic body including a plurality of dielectric layers stacked in a width direction of the ceramic body;
an active layer including mutually adjacent first and second internal electrodes alternately disposed in the width direction of the ceramic body with a respective dielectric layer interposed therebetween;
first and second lead parts, each extending from a corresponding first internal electrode to be exposed to a mounting surface of the ceramic body in a thickness direction of the ceramic body;
a third lead part extending from a corresponding second internal electrode to be exposed to the mounting surface of the ceramic body, and disposed between the first and second lead parts in a length direction of the ceramic body;

first and second external electrodes disposed on the mounting surface of the ceramic body and respectively connected to the first and second lead parts; and a third external electrode disposed on the mounting surface of the ceramic body between the first and second external electrodes and connected to the third lead part, wherein at least one side of one of the first, second, and third lead parts are at least partially formed as an inclined extension portion, and an edge of the first or second lead part, which is the farthest edge thereof from the third lead part, is aligned with an edge of the corresponding first internal electrode in the thickness direction of the ceramic body, the first, second, and third lead parts each comprise inclined extension portions that extend so as to be inclined with respect to an outer periphery of the first and second internal electrodes and vertical extension portions that extend perpendicularly to the outer periphery of the first and second electrodes from the inclined extension portions toward a first main surface of the ceramic body, and a ratio Sa/St of a maximum area Sa, projected on a length-thickness plane, of a first region between the vertical extension portions of the first or second lead part and the third lead part, to a sum St=Sa+Sb of the area Sa and a maximum area Sb, projected on the length-thickness plane, of a second region between the inclined extension portions of the first or second lead part and the third lead part, is in a range of 0.277 to 0.923 ($0.277 \leq Sa/St \leq 0.923$).

4. The multilayer ceramic capacitor of claim 1, wherein the first, second, and third external electrodes each extend to portions of both side surfaces of the ceramic body in the width direction.

5. The multilayer ceramic capacitor of claim 1, wherein the first, second, and third external electrodes comprise conductive layers contacting the corresponding lead parts to thereby be connected to the corresponding lead parts, and plating layers disposed to cover the conductive layers.

6. The multilayer ceramic capacitor of claim 5, wherein the plating layers comprise nickel (Ni) plating layers disposed to cover the conductive layers and tin (Sn) plating layers disposed to cover the nickel plating layers.

7. The multilayer ceramic capacitor of claim 1, further comprising:

fourth and fifth lead parts, each extending from a corresponding first internal electrode to be exposed to a surface opposite the mounting surface of the ceramic body;

a sixth lead part extending from a corresponding second internal electrode to be exposed to the surface opposite the mounting surface of the ceramic body, and disposed between the fourth and fifth lead parts in the length direction of the ceramic body; and an insulation layer disposed on the surface opposite the mounting surface of the ceramic body.

8. The multilayer ceramic capacitor of claim 1, wherein the first internal electrode has fourth and fifth lead parts connected thereto and are exposed to a surface opposite the mounting surface of the ceramic body, and the second internal electrode has a sixth lead part connected thereto that is exposed to the surface opposite the mounting surface of the ceramic body and is disposed between the fourth and fifth lead parts in the length direction of the ceramic body, and the multilayer ceramic capacitor further comprising:

fourth and fifth external electrodes disposed on the surface opposite the mounting surface of the ceramic body and connected to the fourth and fifth lead parts, respectively; and a sixth external electrode disposed on the surface opposite the mounting surface of the ceramic body between the fourth and fifth external electrodes and connected to the sixth lead part.

9. The multilayer ceramic capacitor of claim 8, wherein at least one side of one of the fourth, fifth, and sixth lead parts is at least partially formed as an inclined extension portion.

10. The multilayer ceramic capacitor of claim 8, wherein at least one of the fourth, fifth, and sixth lead parts comprises an inclined extension portion that extends so as to be inclined with respect to an outer periphery of the first or second internal electrode and a vertical extension portion that extends perpendicularly to the outer periphery of the first or second internal electrode from the inclined extension portion toward the surface opposite the mounting surface of the ceramic body.

11. The multilayer ceramic capacitor of claim 8, wherein the fourth, fifth, and sixth lead parts comprise inclined extension portions that extend so as to be inclined with respect to an outer periphery of the first or second internal electrode and vertical extension portions that extend perpendicularly to the outer periphery of the first or second internal electrode from the inclined extension portions toward the surface opposite the mounting surface of the ceramic body, and wherein a ratio Sa/Sb of a maximum area Sa, projected on a length-thickness plane, of a first region between the vertical extension portions of the fourth or fifth lead part and the sixth lead part, to a maximum area Sb, projected on the length-thickness plane, of a second region between the inclined extension portions of the fourth or fifth lead part and the sixth lead part, is in a range of 0.383 to 12 ($0.383 \leq Sa/Sb \leq 12$).

12. The multilayer ceramic capacitor of claim 8, wherein the fourth, fifth, and sixth lead parts comprise inclined extension portions that extend so as to be inclined with respect to an outer periphery of the first or second internal electrode and vertical extension portions that extend perpendicularly to the outer periphery of the first or second internal electrode from the inclined extension portions toward the surface opposite the mounting surface of the ceramic body, and wherein a ratio Sa/St of a maximum area Sa, projected on a length-thickness plane, of a first region between the vertical extension portions of the fourth or fifth lead part and the sixth lead part, to a sum St=Sa+Sb of the area Sa and a maximum area Sb, projected on the length-thickness plane, of a second region between the inclined extension portions of the fourth or fifth lead part and the sixth lead part, is in a range of 0.277 to 0.923 ($0.277 \leq Sa/St \leq 0.923$).

13. The multilayer ceramic capacitor of claim 8, wherein the fourth, fifth, and sixth external electrodes each extend to portions of both side surfaces of the ceramic body in the width direction.

14. The multilayer ceramic capacitor of claim 8, wherein the fourth, fifth, and sixth external electrodes comprise conductive layers contacting the corresponding lead parts to thereby be connected thereto, and plating layers disposed to cover the conductive layers.

15. The multilayer ceramic capacitor of claim 14, wherein the plating layers comprise nickel (Ni) plating layers disposed to cover the conductive layers and tin (Sn) plating layers disposed to cover the nickel plating layers.

16. The multilayer ceramic capacitor of claim 1, further comprising a cover layer disposed on both side surfaces of the active layer in the width direction.

17. The multilayer ceramic capacitor of claim 1, wherein the inclined extension portion is formed of a curve.

18. The multilayer ceramic capacitor of claim 9, wherein the inclined extension portion is formed of a curve.

19. A multilayer ceramic capacitor comprising:
a ceramic body including a plurality of dielectric layers stacked in a width direction of the ceramic body;
an active layer including mutually adjacent first and second internal electrodes alternately disposed in the width direction of the ceramic body with a respective dielectric layer interposed therebetween;
first and second lead parts, each extending from a corresponding first internal electrode to be exposed to a mounting surface of the ceramic body in a thickness direction of the ceramic body;
a third lead part extending from a corresponding second internal electrode to be exposed to the mounting surface of the ceramic body, and disposed between the first and second lead parts in a length direction of the ceramic body;
first and second external electrodes disposed on the mounting surface of the ceramic body and respectively connected to the first and second lead parts; and
a third external electrode disposed on the mounting surface of the ceramic body between the first and second external electrodes and connected to the third lead part,
wherein a side of a first internal electrode connecting the first and second lead parts is formed of a single curve,
at least one side of the third lead part connected to the mounting surface of the ceramic body is at least partially formed of a curve, and
an edge of the first or second lead part, which is the farthest edge thereof from the third lead part, is aligned with an edge of the corresponding first internal electrode in the thickness direction of the ceramic body.

20. The multilayer ceramic capacitor of claim 19, wherein the first and second internal electrodes are disposed to be spaced apart from both end surfaces of the ceramic body in the length direction.

21. The multilayer ceramic capacitor of claim 19, further comprising:
fourth and fifth lead parts, each extending from a corresponding first internal electrode to be exposed to a surface opposite the mounting surface of the ceramic body;
a sixth lead part, each extending from a corresponding second internal electrode to be exposed to the surface opposite the mounting surface of the ceramic body, and disposed between the fourth and fifth lead parts in the length direction; and
an insulation layer disposed on the surface opposite the mounting surface of the ceramic body.

22. The multilayer ceramic capacitor of claim 19, wherein the first internal electrode has a fourth and fifth lead parts connected thereto and are exposed to a surface opposite the mounting surface of the ceramic body, and the second internal electrode has a sixth lead part connected thereto that is exposed to the surface opposite the mounting surface of the ceramic body and is disposed between the fourth and fifth lead parts in the length direction of the ceramic body, and
the multilayer ceramic capacitor further comprising:
fourth and fifth external electrodes disposed on the surface opposite the mounting surface of the ceramic body and connected to the fourth and fifth lead parts, respectively; and
a sixth external electrode disposed on the surface opposite the mounting surface of the ceramic body between the fourth and fifth external electrodes, and connected to the sixth lead part.

23. The multilayer ceramic capacitor of claim 22, wherein a side of a first internal electrode connecting the fourth and fifth lead parts to each other and connected to the surface opposite the mounting surface of the ceramic body is formed as a single curve, and
at least one side of the sixth lead part is at least partially formed of a curve.

24. A board for mounting of a multilayer ceramic capacitor, comprising:
a substrate having first, second, and third electrode pads disposed on the substrate; and
the multilayer ceramic capacitor of claim 1, having the first, second, and third external electrodes respectively disposed on the first, second, and third electrode pads.

25. A board for mounting of a multilayer ceramic capacitor, comprising:
a substrate having first, second, and third electrode pads disposed on the substrate; and
the multilayer ceramic capacitor of claim 19, having the first, second, and third external electrodes respectively disposed on the first, second, and third electrode pads.

26. A multilayer ceramic capacitor, comprising:
a ceramic body;
an active layer within the ceramic body including a plurality of mutually adjacent first and second internal electrodes alternately disposed in a width direction with respective dielectric layers interposed between the first and second internal electrode;
first and second lead parts extending respectively from a corresponding first internal electrode to a mounting surface, and spaced apart from each other in a length direction, of the ceramic body; and
a third lead part disposed between the first and second lead parts in the length direction and extending from a corresponding second internal electrode to the mounting surface of the ceramic body;
wherein at least one side of one of the first, second, and third lead parts extending to the mounting surface of the ceramic body is at least partially inclined with respect to the mounting surface,
an edge of the first or second lead part, which is the farthest edge thereof from the third lead part, is aligned with an edge of the corresponding first internal electrode in a thickness direction of the ceramic body, and
the inclined side is linear.

27. The multilayer ceramic capacitor of claim 26, wherein the first, second and third lead parts terminate at external electrodes on the mounting surface of the ceramic body.

* * * * *